United States Patent
Krassnitzer et al.

(10) Patent No.: US 10,060,026 B2
(45) Date of Patent: Aug. 28, 2018

(54) HIGH-POWER PULSE COATING METHOD

(71) Applicant: Oerlikon Trading AG, Trubbach, Trubbach (CH)

(72) Inventors: Siegfried Krassnitzer, Feldkirch (AT); Denis Kurapov, Walenstradt (CH)

(73) Assignee: OERLIKON SURFACE SOLUTIONS AG, PFÄFFIKON, Pfäffikon SZ (CH)

( * ) Notice: Subject to any disclaimer, the term of this patent is extended or adjusted under 35 U.S.C. 154(b) by 193 days.

(21) Appl. No.: 14/413,480

(22) PCT Filed: Jun. 24, 2013

(86) PCT No.: PCT/EP2013/001853
§ 371 (c)(1),
(2) Date: Jan. 8, 2015

(87) PCT Pub. No.: WO2014/008984
PCT Pub. Date: Jan. 16, 2014

(65) Prior Publication Data
US 2015/0167153 A1 Jun. 18, 2015

(30) Foreign Application Priority Data
Jul. 10, 2012 (DE) .................. 10 2012 013 577

(51) Int. Cl.
C23C 14/32 (2006.01)
C23C 14/00 (2006.01)
(Continued)

(52) U.S. Cl.
CPC ........ *C23C 14/3485* (2013.01); *C23C 14/345* (2013.01); *C23C 14/3464* (2013.01);
(Continued)

(58) Field of Classification Search
CPC .............. C23C 14/345; C23C 14/3464; C23C 14/3485
See application file for complete search history.

(56) References Cited

U.S. PATENT DOCUMENTS

2009/0173622 A1* 7/2009 Weichart ............. C23C 14/0036
204/192.22
2009/0252973 A1* 10/2009 Cremer ............... C23C 14/0641
428/446

FOREIGN PATENT DOCUMENTS

DE          601 04 709 T2    3/2005
DE     10 2008 021 912 A1   11/2009
(Continued)

OTHER PUBLICATIONS

International Search Report for PCT/EP2013/001853 dated Sep. 3, 2013.
(Continued)

*Primary Examiner* — Ibrahime A Abraham
(74) *Attorney, Agent, or Firm* — Pearne & Gordon LLP

(57) ABSTRACT

The invention relates to a method for coating substrates by sputtering of target material, the method comprising the following steps: —applying a first sputtering target made of a first material in a coating chamber to a power pulse by which, during a first time interval, a first amount of energy is transmitted to the sputtering target, wherein the maximum power density exceeds 50 W/cm$^2$ and preferably 500 W/cm$^2$; —applying a second sputtering target made of a second material that is different from the first material in the coating chamber to a power pulse by which, during a second time interval, a second amount of energy is transmitted to the sputtering target, wherein the maximum power density exceeds 50 W/cm$^2$ and preferably 500 W/cm$^2$, characterized in that the first amount of energy differs from the second amount of energy.

10 Claims, 2 Drawing Sheets

(51) Int. Cl.
*C23C 14/34* (2006.01)
*H01J 37/34* (2006.01)

(52) U.S. Cl.
CPC ...... *H01J 37/3405* (2013.01); *H01J 37/3467* (2013.01); *H01J 2237/332* (2013.01)

(56) References Cited

FOREIGN PATENT DOCUMENTS

| DE | 20 2009 018 428 U1 | 9/2011 |
|---|---|---|
| WO | 02/12584 A2 | 2/2002 |
| WO | 2009/132822 A2 | 11/2009 |
| WO | 2011/138331 A2 | 11/2011 |

OTHER PUBLICATIONS

Bouzakis, et al., "Adaption of Graded Cr/Crn-interlayer Thickness to Cemented Carbide Substrates' Roughness for Improving the Adhesion of HPPMS PVD Films and the Cutting Performance", Surface and Coatings Technology, Elsevier, Amersterdam, NL, vol. 205, No. 5, Nov. 25, 2010, pp. 1564-1570.

Vitezslav, et al., "Time-resolved Investigation of Dual High Power Impulse Magnetron Sputtering with Closed Magnetic Field During Deposition of Tia Cu THin Films", Journal of Applied Physics, American Institute of Physics, New York, US, vol. 108, No. 4, Aug. 19, 2010, pp. 43305-43305.

\* cited by examiner

HIGH-POWER PULSE COATING METHOD

The present invention relates to a method for applying a mixed crystal layer by means of High Power Impulse Sputtering (HIPIMS), using at least two targets with different materials.

When, in the state of the art, the targets for depositing the mixed crystal layer are operated simultaneously, the problem arises that, whilst the process parameters are the same, the different targets will be poisoned to a differently high degree. It is not possible in this context to keep both targets in the desired work mode independently from one another since the sputter sources are connected via the volume with the same partial pressure of the reactive gas.

In the framework of the present description, the expressions "spray coating" and "sputtering" are understood as being identical. In the framework of the present invention, the term "target" refers to that component part of a sputter source from which material is removed during the process.

In order to produce mixed crystals, composite targets (compound targets) are used in the sputtering technology according to the state of the art. A target is described in DE60104709 that consists of a first base material and of a second material that is integrated into the first base material in the form of fillers. A further method for producing compound targets is by pressing, in a powder-metallurgical process, two or several metallic powders with grain sizes below 100 μm.

One disadvantage in this respect is that to achieve different concentration ratios in the mixed crystal layer, other targets need to be used in each case. Additionally, the layer composition of layers in which target types of this kind are produced does not match the starting composition of the target material.

In the state of the art, another approach suggests simultaneously operating at least one material by means of dual magnetron or HIPIMS and at least a second material by means of arc evaporation. Accordingly, WO2011138331 discloses a method for depositing mixed crystal layers with at least two different metals (M1, M2) on a substrate by means of PVD technique, characterized in that the deposition of the mixed crystal layer is performed by simultaneously using i) the cathode sputtering method of dual magnetron sputtering or High Power Impulse Magnetron Sputtering (HIPIMS) and ii) arc evaporation (Arc-PVD).

The drawback of this is that because of the two PVD methods, two complex technologies must be implemented in one coating chamber. Furthermore, due to the arc evaporation process, the mixed crystal layer will see the formation of droplets that negatively affect the layer properties such as for example the layer roughness.

The task of the present invention consists in proposing a method with which the problems described above are overcome. In particular, it should be possible with the method to produce a mixed crystal layer by means of HIPIMS and without arc evaporation. According to the invention, this is achieved in that a HIPIMS method is performed using at least two targets with different materials, wherein the operating point suitable for the target material respectively is adjusted separately via the power pulse resp. the output and/or pulse duration.

For a better understanding of the complex processes of a HIPIMS method, the target poisoning will first be covered in a little more detail. The reactive sputter process is determined by the reaction of the target surface with the reactive gas such as for example nitrogen or oxygen. This is called target poisoning. When there is a high degree of poisoning of the target surface and a high reactivity (e.g. nitration or oxidation), this results in a low sputter rate. If in this case the sputter rate is plotted as a function of the reactive gas flow, it thus yields the hysteresis known to the one skilled in the art.

FIG. 1 shows the absorption of nitrogen at the reactive surfaces such as target and layer depending on the ratio of nitrogen flow to argon flow for different pulse durations. In this respect, the average pressure and the Ar flow were also held constant. The pulse power was 1000 W/cm$^2$. The solid line refers to a pulse duration of 50 μs and the dotted line relates to a pulse duration of 2000 μs.

The characteristic curve of a HIPIMS process with a pulse duration of 5 μs shows, when nitrogen is added, a compete utilization of the added nitrogen up to a N2/Ar-flow ratio of approx. 0.9. The nitrogen consumption is more or less proportional to the coating rate. From a ratio of 1.0 and higher, the sputter rate falls strongly due to the nitration of the target surface. This zone is called transition zone. It marks the area of transition to a poisoned target surface. A further addition of nitrogen will cause the target surface to become increasingly poisoned and the rate comes near a minimum value.

If the above-mentioned HIPIMS discharge is operated with a pulse duration of 2000 μs at the otherwise same average sputter power, the transition zone shifts to a poisoned target surface to higher N2/Ar flow ratios. This, however, means that at a specified N2/Ar flow ratio, it is possible by selecting the pulse duration to adjust whether the sputtering occurs with a target in metallic mode, in poisoned mode or in the transition zone. In other words, the operating point can be adjusted by means of selecting the pulse duration. This opens up the possibility, in the case of two or several targets with different materials and thus different response patterns vis-à-vis the sputter gas, to adjust a pulse duration associated with each target material at their operating point independently from one another.

It should be noted that when pulsing with moderate power densities, as used in the conventional sputtering process, the above-mentioned dependency on the pulse duration does not occur.

FIG. 1 shows in particular that when the operating point is specified with the ratio of reactive gas to inert gas being set at 1.2, the HIPIMS sputter process runs in the poisoned mode already when using a pulse duration of 50 μs and the coating rate is approx. 30% lower than the maximum achievable coating rate in the transition zone. By increasing the pulse duration of the HIPIMS power pulse whilst otherwise maintaining a constant average sputter power and the same process gas conditions, the operating point selected with a reactive gas to inert gas ratio of 1.2 will lie again in the transition zone.

The inventors conjecture that in the frame of the HIPIMS process the decisive role is played by the energy quantum per power pulse which results from the product of the pulse power amplitude and of the pulse duration. The number of pulses per time unit can also play a role in this respect.

The invention will now be described in detail on the basis of several embodiments by way of example and with the aids of the figures.

Figure 1:
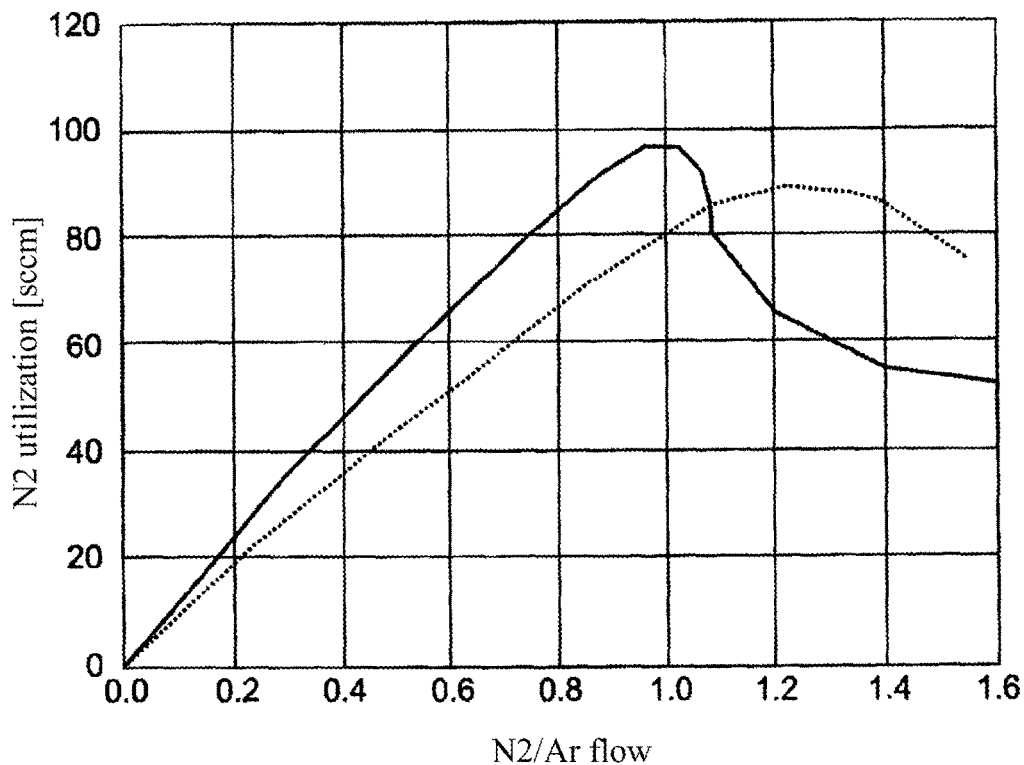
FIG. 1 shows the nitrogen utilization depending on the ratio of the reactive gas to inert gas flow for different pulse durations.

A coating chamber in which an inventive HIPIMS process is to be used comprises a first sputter source Q1 with a first target TA1 of a first target material to be sputtered and a second sputter source Q2 with a second target TA2 of a second target material. In the example, the first target TA1 can consist of aluminum and the second target TA2 of chromium. According to a first embodiment of the present invention, argon and nitrogen in a 1:1 ratio are let into the previously evacuated coating chamber. The target surfaces thus experience the same reactive and inert gas partial pressure. The power density applied at the targets in the pulses is set at 1000 W/cm². The pulse durations (t1, t2) are set individually per target in such a manner that the respective operating point is in the transition zone. The fill factor D, i.e. the ratio between puke duration and repeat interval (i.e. the time interval from the beginning of a pulse at one target until the beginning of the next puke at the same target) is chosen to be the same for both targets. This thus results in a different average output being applied to the targets. The high power density will result in a high ionized proportion of the sputtered material. If a negative bias is applied to the substrates to be coated, this yields dense smooth layers.

According to a second embodiment of the present invention, by contrast to the first embodiment, the power densities applied at the targets and/or the fill factors are adjusted individually.

As is easily understood by the one skilled in the art, the possibility of providing pukes having a high power density with a prespecified puke profile in a controlled manner plays an important role in the inventive method. If the power source allows it, the pukes can be applied at the targets in a completely independent manner from the respective other target. This is in particular the case if a separate power source is allocated to each target. In this respect, high-performance DC generators can be used that deliver their output at the respective associated target for the pulse duration and for the rest of the time supply their output to a so-called power drain (hereinafter called dummy load). Delivering the output to a dummy load makes sense especially at the beginning of the output discharge since the latter follows a buildup characteristic determined by the generator. Using several generators has the disadvantage that a large part of the output, namely the part that is channeled onto the dummy loads is simply not used.

According to a new method, it is possible to use in this connection a high-performance DC generator whose output is applied to the different targets by means of switches sequentially and preferably without interruption of the power delivery. At the end of the pulse interval, the power is then simply switched over onto the target. Again, it may be beneficial to also switch it at the beginning and/or intermittently onto a target replacement (dummy load). However, the loss of power at the dummy load, due to the fact that power is applied to several targets sequentially, is very much reduced.

Figure 2:
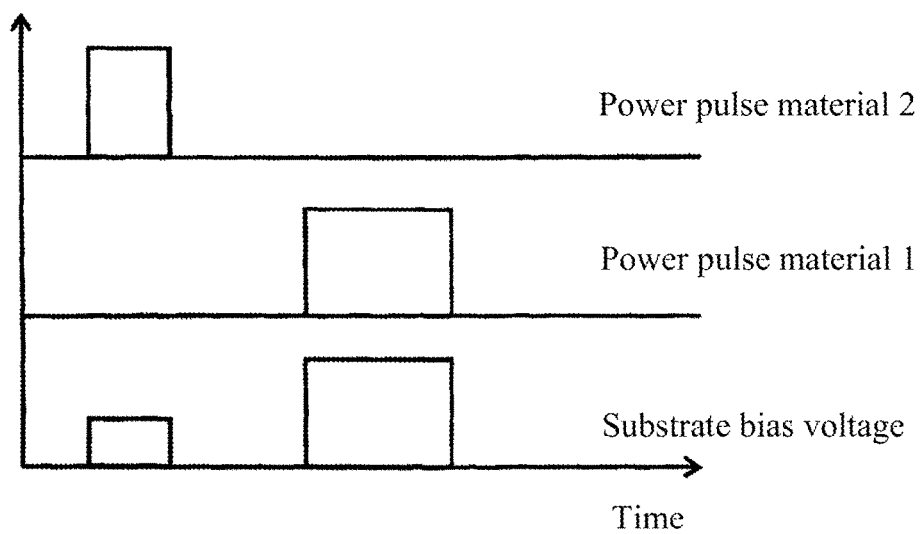
FIG. 2 shows the substrate bias synchronized onto the power pulse.

If power is applied to the targets sequentially with power pulses, there is the possibility according to a particularly preferred embodiment to synchronize the bias applied to the substrates with the pulse sequence and to individually apply a substrate voltage pulse chosen specifically for a target and thus for a layer material. It is thus possible for example for another substrate bias voltage and thus acceleration of the ions to occur for target material 1 than for target material 2. The corresponding situation is represented in FIG. 2.

Figure 3:
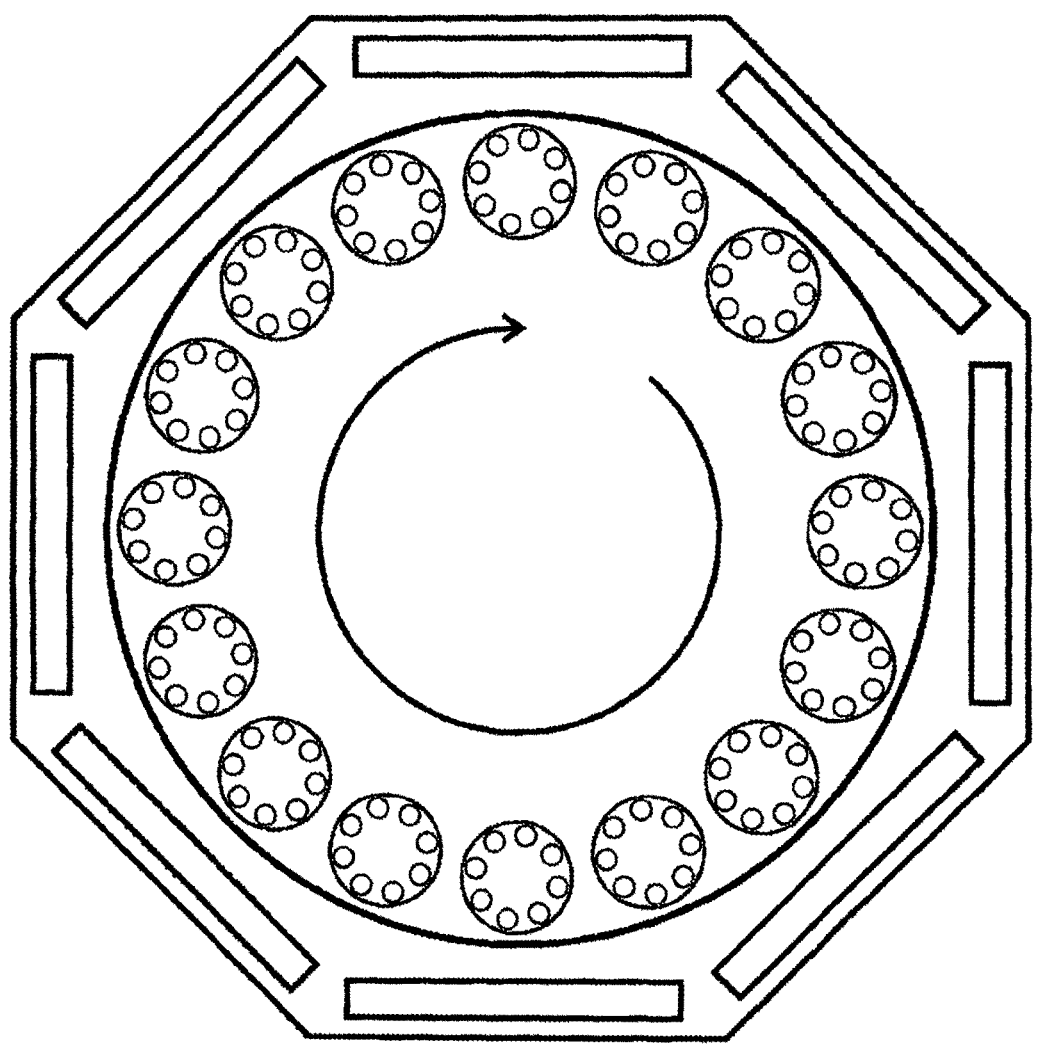
FIG. 3 shows diagrammatically a coating facility.

Coating facilities are often executed as batch systems in which the different coating sources are placed on the chamber walls. The substrates to be coated are then placed in a so-called carousel in workpiece holders and due to the rotation of the carousel are periodically brought past the coating sources. A corresponding situation is represented by way of example and schematically in FIG. 3. With such a structure it can happen that the layer thus generated is not deposited as a homogenous mixed crystal but so-called nano-layers are produced, wherein from one nano-layer to the neighboring one the layer composition changes. Since, as discussed above, the coating rate can be adjusted individually for each target by means of the pulse length, the thickness of the different nano-layers can be adjusted relatively to one another in a simple manner according to the invention.

What is claimed is:

1. Method for coating substrates having substrate surfaces to be coated by sputtering of target material, wherein the substrate surfaces are coated by High Power Impulse Sputtering (HIPIMS), the method comprising the following steps:

applying to a first sputtering target made of a first material in a coating chamber a first power pulse by which, during a first time interval, a first amount of energy is transmitted to the sputtering target, wherein the maximum power density exceeds 500 W/cm²;

applying to a second sputtering target made of a second material that is different from the first material in the coating chamber a second power pulse by which, during a second time interval, a second amount of energy is transmitted to the sputtering target, wherein the first amount of energy differs from the second amount of energy, and wherein the maximum power density exceeds 500 W/cm², setting a ratio of reactive gas flow to inert gas flow, depositing a mixed crystal layer onto the substrate surfaces to be coated by:

applying a first pulse duration to the first sputtering target to operate the first sputtering target at a first operating point within a first zone starting from a point at which the coating rate for the first sputtering target falls from a maximum achievable coating rate and ending at a point at which the coating rate for the first sputtering target is approximately 30% lower than the maximum achievable coating rate; and applying a second pulse duration to the second sputtering target to operate the second sputtering target at a second operating point within a second zone starting from the point at which the coating rate for the second sputtering target falls from the maximum achievable coating rate and ending at the point at which the coating rate for the second sputtering target is approximately 30% lower than the maximum achievable coating rate, wherein the first sputtering target and the second sputtering target are operated at the first operating point and at the second operating point independently from one another.

2. Method according to claim 1, characterized in that the second time interval is chosen to be longer than the first time interval.

3. Method according to claim 1, characterized in that the first and second time interval is chosen between 10 μs and 100 ms.

4. Method according to claim 3, characterized in that the first and second time interval is chosen between 50 μs and 5 ms.

5. Method according to claim 1, characterized in that the first material and the second material comprise elements from the group formed by: the elements titanium, aluminum, silicon, chromium, boron, carbon, elements from the groups 4A, 4B, 4C of the periodic system of elements as well as the combination of two or more of these elements.

6. Method according to claim 1, characterized in that at the substrates to be coated, a substrate bias is applied at least occasionally synchronous with the first and second power pulses and the substrate bias is selected specifically to the sputtering target.

7. Method according to claim 1, characterized in that inert gas is used as working gas during the process, wherein the inert gas is used from the group of the elements He, Ne, Ar, Kr or the combination of two or several thereof.

8. Method according to claim 1, characterized in that during the process reactive gas from the group of the elements or compounds $N_2$, $O_2$, $C_2H_2$, $CH_4$, silane, TMS, $CO_2$ or the combination of several group members is used at least occasionally.

9. Method according to claim 1, characterized in that for the deposition of the mixed crystal layer, the targets are operated simultaneously.

10. Method according to claim 1, characterized in that the substrates are placed in relation to the coating sources in such a manner that the substrate surfaces to be coated are periodically brought past the coating sources, wherein the layer thus generated is deposited not as a homogenous mixed crystal but as a layer formed of several nano-layers, wherein from one nano-layer to the neighboring one the layer composition changes.

* * * * *

UNITED STATES PATENT AND TRADEMARK OFFICE
CERTIFICATE OF CORRECTION

| | | |
|---|---|---|
| PATENT NO. | : 10,060,026 B2 | Page 1 of 1 |
| APPLICATION NO. | : 14/413480 | |
| DATED | : August 28, 2018 | |
| INVENTOR(S) | : Siegfried Krassnitzer et al. | |

It is certified that error appears in the above-identified patent and that said Letters Patent is hereby corrected as shown below:

In the Specification

Column 2, Line 14, "5 µs" should be -- 50 µs --.

Signed and Sealed this
Sixth Day of November, 2018

Andrei Iancu
*Director of the United States Patent and Trademark Office*